(12) United States Patent
Nabata et al.

(10) Patent No.: US 9,374,057 B2
(45) Date of Patent: Jun. 21, 2016

(54) ELECTRONIC DEVICE AND METHOD FOR CONTROLLING ELECTRONIC DEVICE

(71) Applicant: KYOCERA CORPORATION, Kyoto (JP)

(72) Inventors: Toshihisa Nabata, Zama (JP); Satoshi Mizuta, Sagamihara (JP); Tomoaki Miyano, Kameyama (JP); Kiyokazu Sato, Yokohama (JP); Akio Kihara, Yokohama (JP); Shun Kazama, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 92 days.

(21) Appl. No.: 14/378,493

(22) PCT Filed: May 22, 2013

(86) PCT No.: PCT/JP2013/003248
§ 371 (c)(1),
(2) Date: Aug. 13, 2014

(87) PCT Pub. No.: WO2013/175780
PCT Pub. Date: Nov. 28, 2013

(65) Prior Publication Data
US 2015/0043750 A1    Feb. 12, 2015

(30) Foreign Application Priority Data

May 22, 2012 (JP) ................. 2012-116758

(51) Int. Cl.
*H04R 3/00* (2006.01)
*H03G 5/16* (2006.01)
(Continued)

(52) U.S. Cl.
CPC ............ *H03G 5/165* (2013.01); *H04M 1/6016* (2013.01); *H04R 1/46* (2013.01); *H04R 7/045* (2013.01); *H04M 1/035* (2013.01);
(Continued)

(58) Field of Classification Search
None
See application file for complete search history.

(56) References Cited

U.S. PATENT DOCUMENTS

| 2010/0092016 A1 | 4/2010 | Iwano et al. |
| 2011/0249851 A1 | 10/2011 | Iwano et al. |

(Continued)

FOREIGN PATENT DOCUMENTS

| JP | H05-110650 A | 4/1993 |
| JP | H05-199590 A | 8/1993 |

(Continued)

OTHER PUBLICATIONS

International Search Report; PCT/JP2013/003248; Sep. 3, 2013.
(Continued)

*Primary Examiner* — Muhammad E Edun
(74) *Attorney, Agent, or Firm* — Studebaker & Brackett PC

(57) ABSTRACT

An echo caused by sound leakage from a housing that vibrates due to a vibrating body is reduced. An electronic device (1) according to the present invention includes a piezoelectric element (30), a vibrating plate (10) that vibrates due to the piezoelectric element (30), microphones (42, 43), and an equalizer (44), the electronic device (1) causing the vibrating plate (10) to generate air-conducted sound and vibration sound that is transmitted by vibrating a part of a human body. The equalizer (44) makes a low-range emphasis setting, to emphasize a low frequency range more than a high frequency range of the air-conducted sound, when the volume of the air-conducted sound collected by the microphones (42, 43) exceeds a predetermined threshold.

6 Claims, 13 Drawing Sheets

(51) Int. Cl.
*H04M 1/60* (2006.01)
*H04R 7/04* (2006.01)
*H04R 1/46* (2006.01)
*H04M 1/03* (2006.01)
*H04R 3/04* (2006.01)
*H04R 17/02* (2006.01)

(52) U.S. Cl.
CPC ............... *H04R 3/04* (2013.01); *H04R 17/02* (2013.01); *H04R 2440/05* (2013.01); *H04R 2440/07* (2013.01); *H04R 2499/11* (2013.01)

(56) References Cited

U.S. PATENT DOCUMENTS

2012/0289162 A1* 11/2012 Hosoi et al. .................. 455/41.3
2014/0093090 A1* 4/2014 Bajic et al. ..................... 381/74

FOREIGN PATENT DOCUMENTS

| | | |
|---|---|---|
| JP | H06-30090 A | 2/1994 |
| JP | H09-36940 A | 2/1997 |
| JP | 2004-187031 A | 7/2004 |
| JP | 2005-348193 A | 12/2005 |
| JP | 2007-082009 A | 3/2007 |
| JP | 2010-124446 A | 6/2010 |

OTHER PUBLICATIONS

The Written Opinion of the International Searching Authority; PCT/JP2013/003248 issued on Sep. 3, 2013; with English language concise explanation.

* cited by examiner

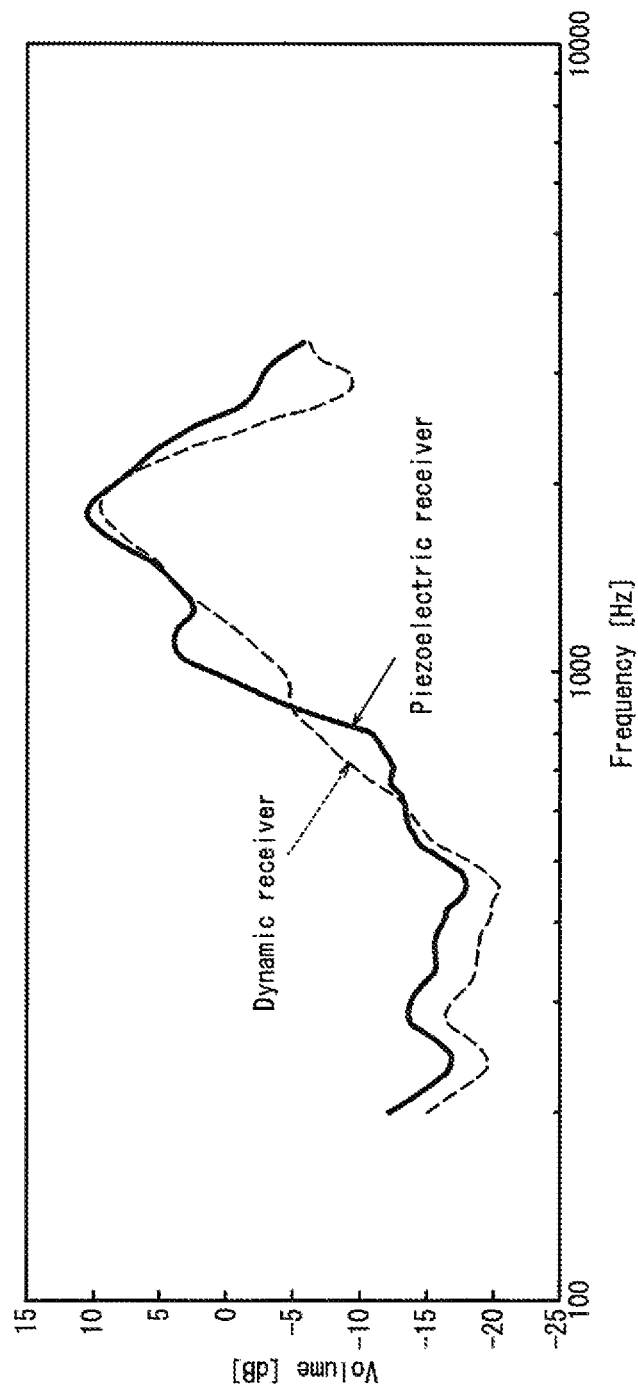

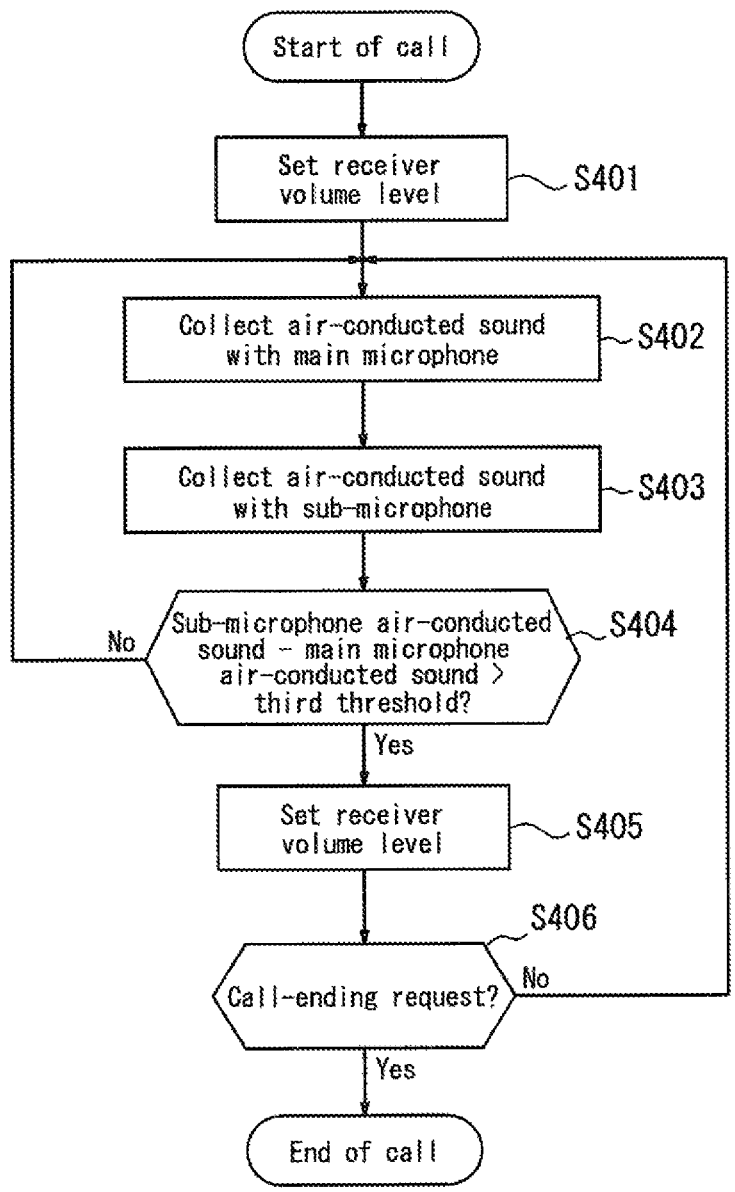

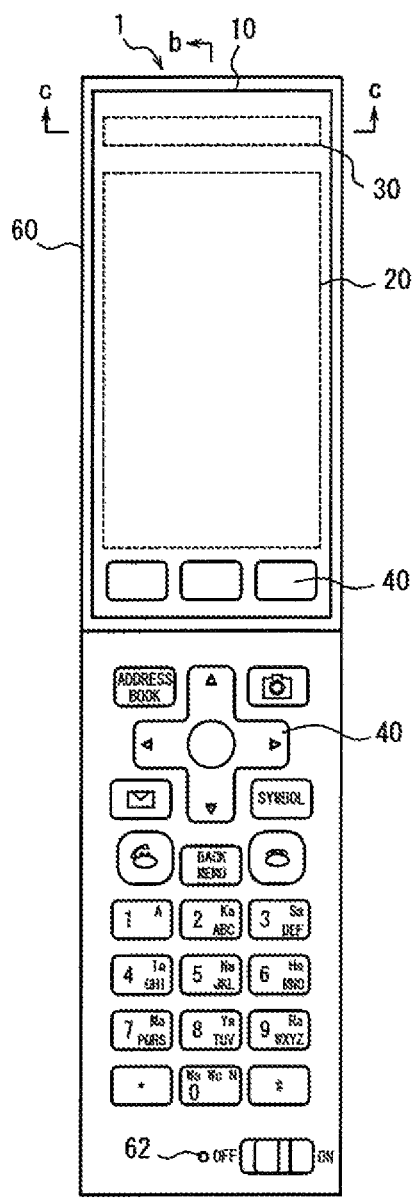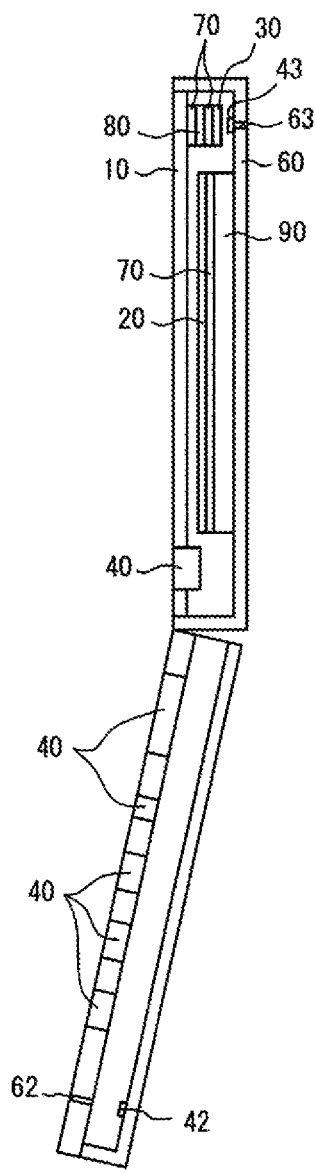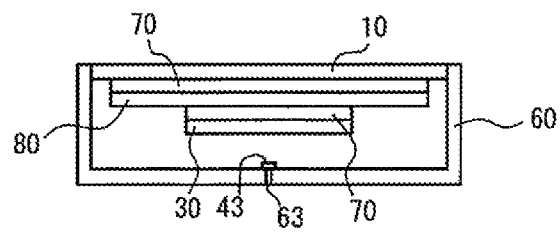

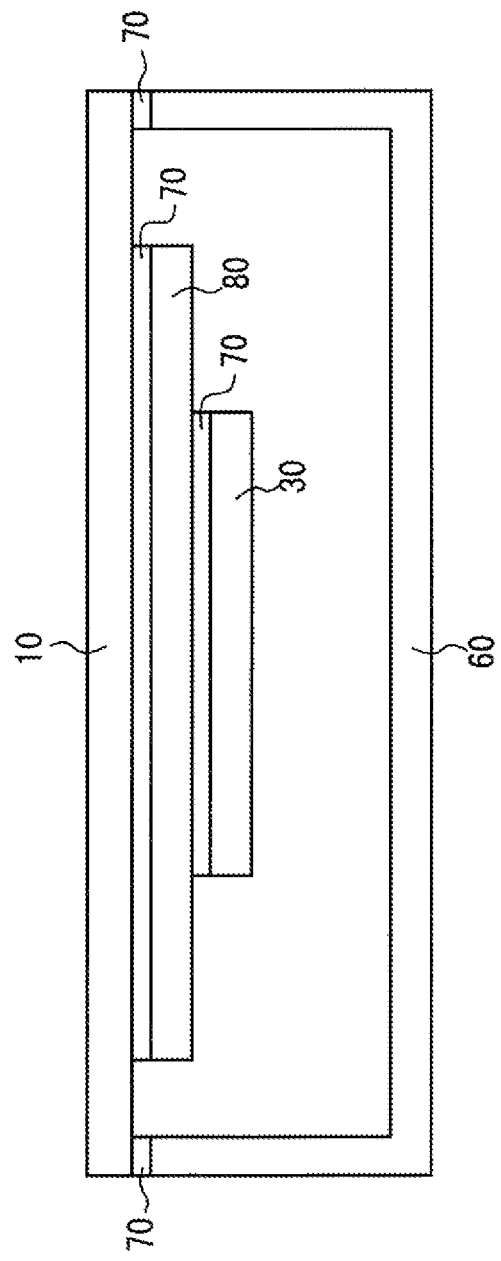

ELECTRONIC DEVICE AND METHOD FOR CONTROLLING ELECTRONIC DEVICE

CROSS-REFERENCE TO RELATED APPLICATION

This application claims priority to and the benefit of Japanese Patent Application No. 2012-116758 filed May 22, 2012, the entire contents of which are incorporated herein by reference.

TECHNICAL FIELD

The present invention relates to an electronic device and a method for controlling an electronic device that vibrate a panel by applying a predetermined electric signal (audio signal) to a piezoelectric element and that transmit air-conducted sound and vibration sound to a user by transmitting the vibration of the panel to the user's body.

BACKGROUND

Patent Literature 1 recites an electronic device, such as a mobile phone or the like, that transmits air-conducted sound and bone-conducted sound to a user. As the air-conducted sound, Patent Literature 1 recites a sound that is transmitted to the user's auditory nerve by air vibrations, caused by a vibrating object, that are transmitted through the external ear canal to the eardrum and cause the eardrum to vibrate. As bone-conducted sound, Patent Literature 1 recites a sound that is transmitted to the user's auditory nerve through a portion of the user's body (such as the cartilage of the outer ear) that is contacting a vibrating object.

Patent Literature 1 recites a telephone in which a rectangular vibrating body, formed from a piezoelectric bimorph and a flexible substance, is attached to an outer surface of a housing via an elastic member. Patent Literature 1 also discloses that when voltage is applied to the piezoelectric bimorph in the vibrating body, the piezoelectric material expands and contracts in the longitudinal direction, causing the vibrating body to undergo flexure vibration. Air-conducted sound and bone-conducted sound are transmitted to the user when the user contacts the vibrating body to the auricle.

CITATION LIST

Patent Literature 1: JP 2005-348193 A

SUMMARY

In the electronic device disclosed in Patent Literature 1, the housing of the telephone vibrates due to the vibrating body. In order for the user to appropriately hear air-conducted sound and bone-conducted sound, the user needs to press the ear to a predetermined position of the housing. When the position pressed by the user's ear is misaligned, the air-conducted sound may leak and be transmitted to a sound collecting microphone, generating an echo. Patent Literature 1, however, does not take into consideration measures against such an echo.

The present invention provides an electronic device and a method for controlling an electronic device that can reduce an echo caused by sound leakage from the housing that vibrates due to a vibrating body.

An electronic device according to the present invention includes: a piezoelectric element; a vibrating plate configured to vibrate due to the piezoelectric element; a microphone; and an equalizer, the electronic device causing the vibrating plate to generate air-conducted sound and vibration sound that is transmitted by vibrating a part of a human body, and the equalizer making a low-range emphasis setting, to emphasize a low frequency range more than a high frequency range of the air-conducted sound, when a volume of the air-conducted sound collected by the microphone exceeds a predetermined threshold.

The microphone may be a first microphone that collects speech of a user, and the equalizer may make the low-range emphasis setting when a volume of the air-conducted sound collected by the first microphone exceeds a first threshold.

The vibrating plate may be positioned in an expected contact region of a housing where an ear of a user is expected to contact, and the first microphone may be provided in a mouth-neighboring region of the housing near a mouth of the user.

The microphone may be a second microphone that collects surrounding sound, and the equalizer may make the low-range emphasis setting when a volume of the air-conducted sound collected by the second microphone exceeds a second threshold.

The vibrating plate may be positioned in an expected contact region of a housing where an ear of a user is expected to contact, and the second microphone may be provided on an opposite face from the vibrating plate of the housing.

The electronic device may further include, as the microphone, a first microphone that collects speech of a user and a second microphone that collects surrounding sound, and the equalizer may make the low-range emphasis setting when a volume of the air-conducted sound collected by the first microphone exceeds a first threshold or when a volume of the air-conducted sound collected by the second microphone exceeds a second threshold.

A method according to the present invention for controlling an electronic device that includes a piezoelectric element, a vibrating plate configured to vibrate due to the piezoelectric element, a microphone, and an equalizer, the electronic device causing the vibrating plate to generate air-conducted sound and vibration sound that is transmitted by vibrating a part of a human body includes the step of: making a low-range emphasis setting, for the equalizer to emphasize a low frequency range more than a high frequency range of the air-conducted sound, when a volume of the air-conducted sound collected by the microphone exceeds a predetermined threshold.

The microphone may be a first microphone that collects speech of a user, and the equalizer may make the low-range emphasis setting when a volume of the air-conducted sound collected by the first microphone exceeds a first threshold.

The microphone may be a second microphone that collects surrounding sound, and the equalizer may make the low-range emphasis setting when a volume of the air-conducted sound collected by the second microphone exceeds a second threshold.

The electronic device may further include, as the microphone, a first microphone that collects speech of a user and a second microphone that collects surrounding sound, and the equalizer may make the low-range emphasis setting when a volume of the air-conducted sound collected by the first microphone exceeds a first threshold or when a volume of the air-conducted sound collected by the second microphone exceeds a second threshold.

An electronic device according to the present invention includes: a piezoelectric element; a vibrating plate configured to vibrate due to the piezoelectric element; a main microphone; a sub-microphone; and a control unit, the electronic device causing the vibrating plate to generate air-conducted sound and vibration sound that is transmitted by vibrating a part of a human body, and the control unit controlling the piezoelectric element so as to suppress or reduce vibration of the vibrating plate when a difference between a volume of the air-conducted sound collected by the first microphone and a volume of the air-conducted sound collected by the second microphone exceeds a predetermined threshold.

A method according to the present invention for controlling an electronic device that includes a piezoelectric element, a vibrating plate configured to vibrate due to the piezoelectric element, a main microphone, a sub-microphone, and a control unit, the electronic device causing the vibrating plate to generate air-conducted sound and vibration sound that is transmitted by vibrating a part of a human body includes the step of: controlling, via the control unit, the piezoelectric element so as to suppress or reduce vibration of the vibrating plate when a difference between a volume of the air-conducted sound collected by the first microphone and a volume of the air-conducted sound collected by the second microphone exceeds a predetermined threshold.

According to the electronic device and the method for controlling an electronic device of the present invention, it is possible to reduce an echo caused by sound leakage from the housing that vibrates due to a vibrating body.

BRIEF DESCRIPTION OF DRAWINGS

The present invention will be further described below with reference to the accompanying drawings, wherein:

FIG. 4 illustrates an example of sound leakage characteristics of a piezoelectric receiver;

FIG. 8 is a flowchart of receiver volume level setting;

FIGS. 11(a), 11(b), and 11(c) illustrate a housing structure of the electronic device according to Embodiment 2;

FIG. 13 illustrates an example of joining the panel and the housing.

DESCRIPTION OF EMBODIMENTS

Figure 1:
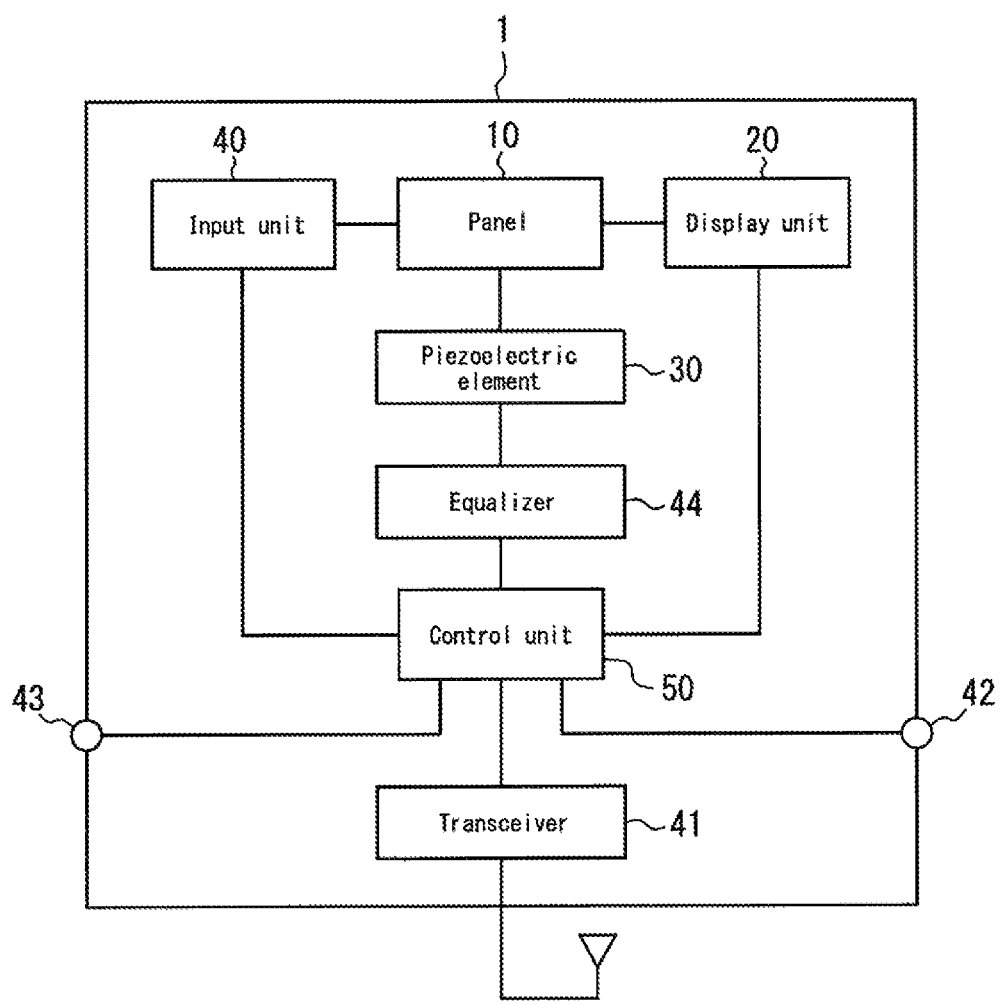
FIG. 1 is a functional block diagram of an electronic device according to an embodiment of the present invention.

Embodiments of the present invention will be described in detail with reference to the accompanying drawings. FIG. 1 is a functional block diagram of an electronic device 1 according to an embodiment of the present invention. The electronic device 1 is, for example, a mobile phone (smartphone) and is provided with a panel 10, a display unit 20, a piezoelectric element 30, an input unit 40, and a control unit 50. Furthermore, the electronic device 1 is provided with a transceiver 41, a main microphone 42 (first microphone), a sub-microphone 43 (second microphone), and an equalizer 44. The transceiver 41 has a well-known structure and is connected wirelessly to a communications network through a base station or the like. The main microphone 42 and the sub-microphone 43 are well-known microphones, such as a condenser microphone or the like, and collect sound such as speech by the user, surrounding sound, and the like during a conversation through the transceiver 41. The main microphone 42 mainly collects speech by the user and is provided in a mouth-neighboring region of the housing near the mouth of the user. The sub-microphone 43 mainly collects surrounding sound and is provided on the opposite face from the panel 10 in the housing of the electronic device 1. The equalizer 44 adjusts the frequency characteristics of the air-conducted sound generated by vibration, and in greater detail, adjusts the electric signal applied to the piezoelectric element 30 by the control unit 50.

The panel 10 is a touch panel that detects contact, a cover panel that protects the display unit 20, or the like. The panel 10 functions as a vibrating plate that vibrates due to the piezoelectric element 30. The panel 10 is positioned in an expected contact region of the housing where the user's ear is expected to contact. For example, the expected contact region is the front face of the housing contacted by the user's ear. The panel 10 is, for example, made from glass or a synthetic resin such as acrylic or the like. The panel 10 is preferably plate-like in shape. The panel 10 may be a flat plate or may be a curved panel, the surface of which is smoothly inclined. When the panel 10 is a touch panel, the panel 10 detects contact by the user's finger, a pen, a stylus pen, or the like. Any detection system may be used in the touch panel, such as a capacitive system, a resistive film system, a surface acoustic wave system (or an ultrasonic wave system), an infrared system, an electromagnetic induction system, a load detection system, or the like.

The display unit 20 is a display device such as a liquid crystal display, an organic EL display, an inorganic EL display, or the like. The display unit 20 is provided on the back face of the panel 10. The display unit 20 is disposed on the back face of the panel 10 by a joining member (for example, adhesive). The display unit 20 may be adhered to the panel 10 by a joining member (for example, adhesive) or disposed at a distance from the panel 10 and supported by the housing of the electronic device 1.

The piezoelectric element 30 is formed by elements that, upon application of an electric signal (voltage), either expand and contract or flex (bend) in accordance with the electromechanical coupling coefficient of their constituent material. Ceramic or crystal elements, for example, are used. The piezoelectric element 30 may be a unimorph, bimorph, or laminated piezoelectric element. Examples of a laminated piezoelectric element include a laminated unimorph element with layers of unimorph (for example, 16 or 24 layers) and a laminated bimorph element with layers of bimorph (for example, 16 or 24 layers). Such a laminated piezoelectric element may be configured with a laminated structure formed by a plurality of dielectric layers composed of, for example, lead zirconate titanate (PZT) and electrode layers disposed between the dielectric layers. Unimorph expands and contracts upon the application of an electric signal (voltage), and bimorph flexes upon the application of an electric signal (voltage).

The piezoelectric element 30 is disposed on the back face of the panel 10 (the face on the inner side of the electronic device 1). The piezoelectric element 30 is attached to the panel 10 by a joining member (for example, double-sided tape). The piezoelectric element 30 may be attached to the panel 10 with an intermediate member (for example, sheet metal) therebetween. Once disposed on the back face of the panel 10, the piezoelectric element 30 is separated from the inner surface of a housing 60 by a predetermined distance. The piezoelectric element 30 is preferably separated from the inner surface of the housing 60 by the predetermined distance even when expanding and contracting or flexing. In other words, the distance between the piezoelectric element 30 and the inner face of the housing 60 is preferably larger than the maximum amount of deformation of the piezoelectric element 30.

The input unit 40 accepts operation input from the user and may be configured, for example, using operation buttons (operation keys). Note that when the panel 10 is a touch panel, the panel 10 can also accept operation input from the user by detecting contact by the user.

The control unit 50 is a processor that controls the electronic device 1. The control unit 50 applies a predetermined electric signal (a voltage corresponding to an audio signal) to the piezoelectric element 30 via the equalizer 44. The voltage that the control unit 50 applies to the piezoelectric element 30 may, for example, be ±15 V. This is higher than ±5 V, i.e. the applied voltage of a so-called panel speaker for conduction of sound by air-conducted sound rather than vibration sound. In this way, even if the user presses the panel 10 against the user's body for example with a force of 3 N or greater (a force of 5 N to 10 N), sufficient vibration is generated in the panel 10, so that a vibration sound can be generated via a part of the user's body. Note that the magnitude of the applied voltage used may be appropriately adjusted in accordance with the fixation strength of the panel 10 with respect to the housing or a support member, or in accordance with the performance of the piezoelectric element 30. Upon the control unit 50 applying the electric signal to the piezoelectric element 30, the piezoelectric element 30 expands and contracts or flexes in the longitudinal direction. At this point, the panel 10 to which the piezoelectric element 30 is attached deforms in conjunction with the expansion and contraction or flexing of the piezoelectric element 30. The panel 10 thus vibrates. The panel 10 flexes due to expansion and contraction or to bending of the piezoelectric element 30. The panel 10 is bent directly by the piezoelectric element 30. Stating that "the panel 10 is bent directly by the piezoelectric element" differs from the phenomenon utilized in known panel speakers, whereby the panel deforms upon vibration of a particular region of the panel due to the inertial force of a piezoelectric actuator constituted by a piezoelectric element disposed in the casing. Stating that "the panel 10 is bent directly by the piezoelectric element" refers instead to how expansion and contraction or bending (flexure) of the piezoelectric element directly bends the panel via the joining member or via the joining member and the below-described reinforcing member 80. Therefore, along with generating air-conducted sound, the panel 10 generates vibration sound via a part of the user's body when the user brings a part of the body (such as the cartilage of the outer ear) into contact. For example, the control unit 50 can apply an electric signal, corresponding to an audio signal related to the other party's voice, to the piezoelectric element 30 to generate air-conducted sound and vibration sound that correspond to the audio signal. The audio signal may be related to ringtones, music including songs, or the like. Note that the audio signal pertaining to the electric signal may be based on music data stored in internal memory of the electronic device 1, or may be music data stored on an external server or the like and played back over a network.

The panel 10 vibrates not only in the region in which the piezoelectric element 30 is attached, but also in a region separate from the attachment region. In the region of vibration, the panel 10 includes a plurality of locations at which the panel 10 vibrates in a direction intersecting the main surface of the panel 10. At each of these locations, the value of the vibration amplitude changes over time from positive to negative or vice-versa. At a given instant during vibration of the panel 10, portions with a relatively large vibration amplitude and portions with a relatively small vibration amplitude appear to be distributed randomly or cyclically over nearly the entire panel 10. In other words, a plurality of vibration waves are detected across the entire panel 10. The voltage that the control unit 50 applies to the piezoelectric element 30 may be ±15 V to prevent dampening of the above-described vibration of the panel 10 even if the user presses the panel 10 against the user's body with a force of, for example, 5 N to 10 N. Therefore, the user can hear sound by contacting a region distant from the above-described attachment region of the panel 10 to the ear.

Figure 2:
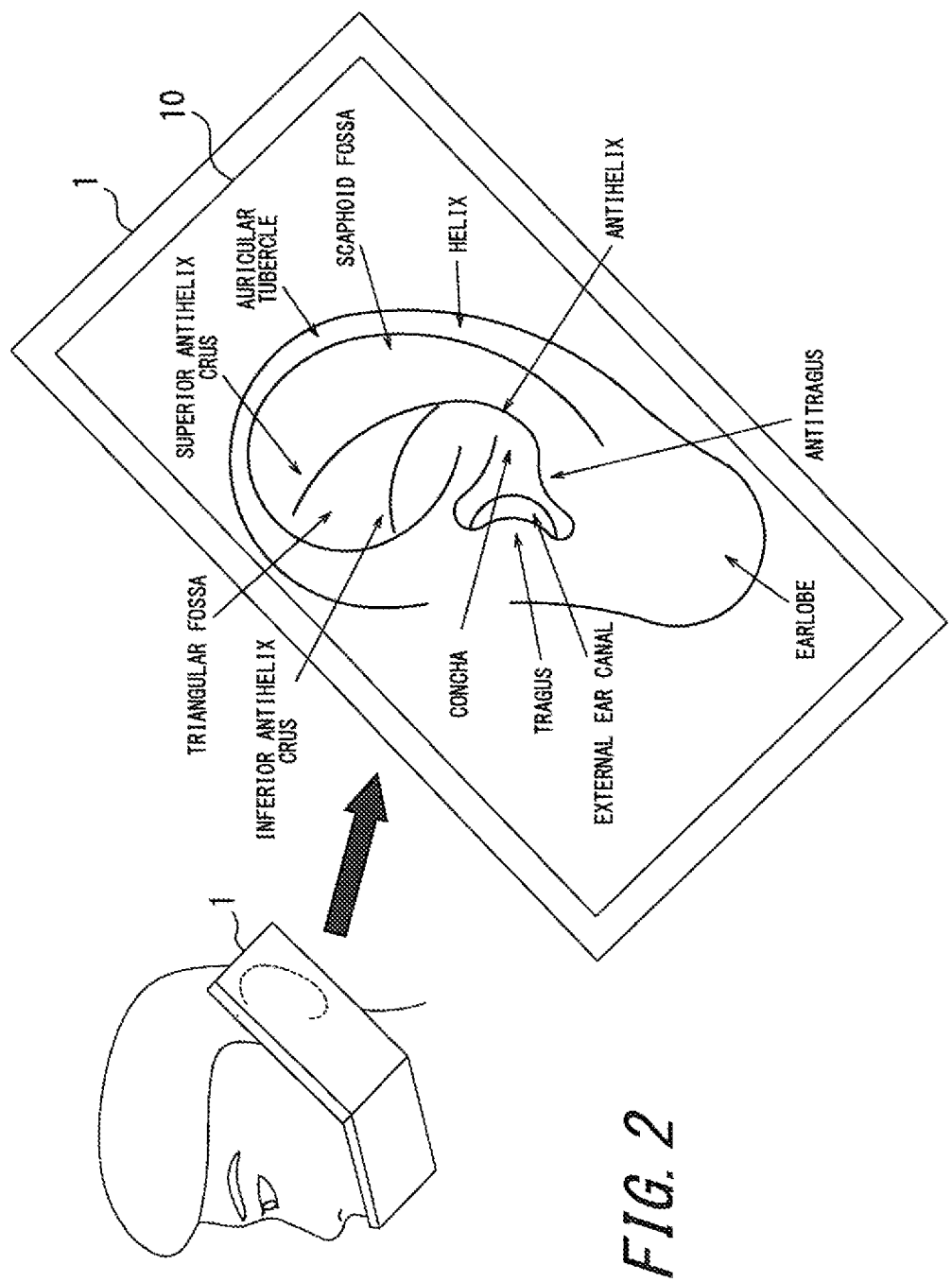
FIG. 2 illustrates an appropriate configuration of a panel.

The panel 10 may be nearly the same size as the user's ear. As illustrated in FIG. 2, the panel 10 may also be larger than the user's ear. Adopting such a size makes it easier for the panel 10 of the electronic device 1 to cover the entire ear when the user listens to sound, thus making it difficult for surrounding sounds (noise) to enter the external ear canal. The region of the panel 10 that vibrates should be larger than a region having a length corresponding to the distance from the inferior antihelix crus to the antitragus and a width corresponding to the distance from the tragus to the antihelix. The region of the panel 10 that vibrates preferably has a length corresponding to the distance from a position in the helix near the superior antihelix crus to the earlobe and a width corresponding to the distance from the tragus to a position in the helix near the antihelix. The region with the above length and width may be a rectangular region or may be an elliptical region with the above length as the major axis and the above width as the minor axis. The average size of a Japanese person's ear can be looked up in sources such as the Japanese Body Dimension Data (1992-1994) gathered by the Research Institute of Human Engineering for Quality Life (HQL). Note that if the panel 10 is at least as large as the average size of a Japanese person's ear, it is thought that the panel 10 will be a size capable of covering the entire ear of most non-Japanese people.

By vibration of the panel 10, the electronic device 1 can transmit vibration sound through a part of the user's body (such as the cartilage of the outer ear) and air-conducted sound to the user. Therefore, when sound is output at a volume equivalent to a known dynamic receiver, the sound that is transmitted to the periphery of the electronic device 1 by air vibrations due to vibration of the panel 10 is smaller than with a dynamic receiver. Accordingly, the electronic device 1 is appropriate for listening to recorded messages, for example, on the train or the like.

The electronic device 1 generates a sound transmitted inside the human body by vibration of the panel 10 caused by the piezoelectric element 30. The sound transmitted inside the human body vibrates the middle ear or the inner ear via soft tissue (such as cartilage) of the human body. The electronic device 1 transmits vibration sound by vibration of the panel 10, and therefore even if the user is wearing earphones or headphones, for example, the user can hear sound through the earphones or headphones and through a part of the body by contacting the electronic device 1 against the earphones or headphones.

The electronic device 1 transmits sound to a user by vibration of the panel 10. Therefore, if the electronic device 1 is not provided with a separate dynamic receiver, it is unnecessary to form an opening (sound discharge port) for sound transmission in the housing, thereby simplifying waterproof construction of the electronic device 1. On the other hand, if the electronic device 1 is provided with a dynamic receiver, the sound discharge port should be blocked by a member permeable by air but not liquid. Gore-Tex (registered trademark) is an example of a member permeable by air but not liquid.

Figure 3A:
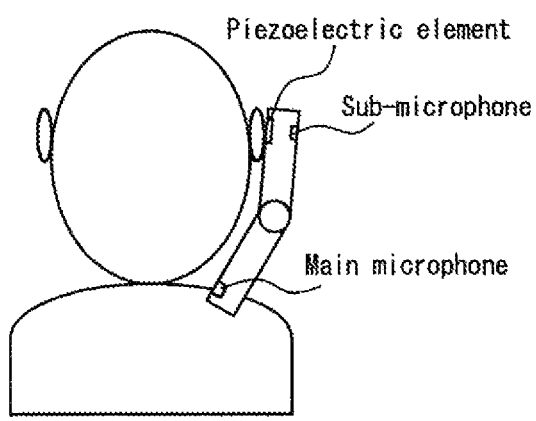
FIGS. 3(a) and 3(b) illustrate an overview of echo generation due to the position pressed by the ear.
Figure 3B:
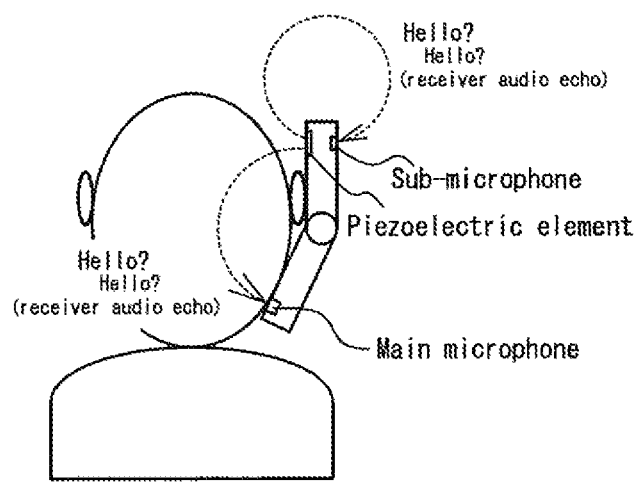

Furthermore, the electronic device 1 reduces an echo caused by sound leakage generated when the position on the housing pressed by the user's ear is misaligned. In order to appropriately hear air-conducted sound and vibration sound generated by vibration, the user needs to press the ear to a predetermined position of the housing. When the position on the housing pressed by the user's ear is misaligned, the air-conducted sound may leak and be transmitted to a sound collecting microphone, generating an echo. FIGS. 3(*a*) and 3(*b*) illustrate an overview of echo generation due to the position pressed by the ear. FIG. 3(*a*) is an example of an appropriate position pressed by the ear, whereas FIG. 3(*b*) illustrates an example of the position pressed by the ear being misaligned. Comparing the appropriate position pressed by the ear and the misaligned position pressed by the ear shows that for the misaligned position pressed by the ear, air-conducted sound due to vibration easily leaks to the surrounding area, and an echo is generated by receiver audio being transmitted to the main microphone and the sub-microphone.

In the piezoelectric receiver that vibrates the panel 10 with the piezoelectric element 30, the amount of sound leakage in the high frequency component is higher than for a typical dynamic receiver. FIG. 4 illustrates an example of sound leakage characteristics of each receiver. As illustrated in FIG. 4, the amount of sound leakage in the piezoelectric receiver is greater than in the dynamic receiver in particular in the high frequency component of 2 kHz or more. Therefore, the equalizer 44 makes a low-range emphasis setting, to emphasize the low frequency range more than the high frequency range of the air-conducted sound, when the volume of the air-conducted sound collected by the microphones exceeds a predetermined threshold. As a result, the volume in the high frequency range with a large amount of sound leakage is suppressed, or the volume in the low frequency range is increased, thereby satisfying receiver characteristics while also allowing for the reduction of an echo caused by sound leakage. Note that the low-range emphasis setting to emphasize the low frequency range more than the high frequency range may include the cases of suppressing or reducing only the high frequency range without particularly processing the low frequency range, and of emphasizing only the low frequency range without particularly processing the high frequency range. Furthermore, the low-range emphasis setting to emphasize the low frequency range more than the high frequency range may include the cases of adjusting these ranges independently from adjustment of the overall volume and of reducing or increasing the overall volume at the same time as adjustment of each frequency range.

For example, during the low-range emphasis setting, the equalizer 44 can vibrate the piezoelectric element 30 while reducing the frequency component higher than 2 kHz and emphasizing the frequency component at 2 kHz or less. In this way, in particular at high frequencies for which sound leakage easily occurs, the amount of vibration of the piezoelectric element 30 can be reduced, thereby suppressing or reducing sound leakage. Note that since the sound leakage characteristics vary depending on the structure of the electronic device 1, the predetermined threshold is of course not limited to 2 kHz. For example, the reproduction sound signal for a voice call may include frequencies from 0.4 kHz to 3.4 kHz, and the predetermined threshold may be set to a value between 0.4 kHz and 3.4 kHz. While satisfying receiver characteristics, it is thus possible to prevent sound leakage. Alternatively, the damping ratio (or rate of increase) may be set in small increments of 100 Hz or 500 Hz over the human hearing range.

Figure 5:
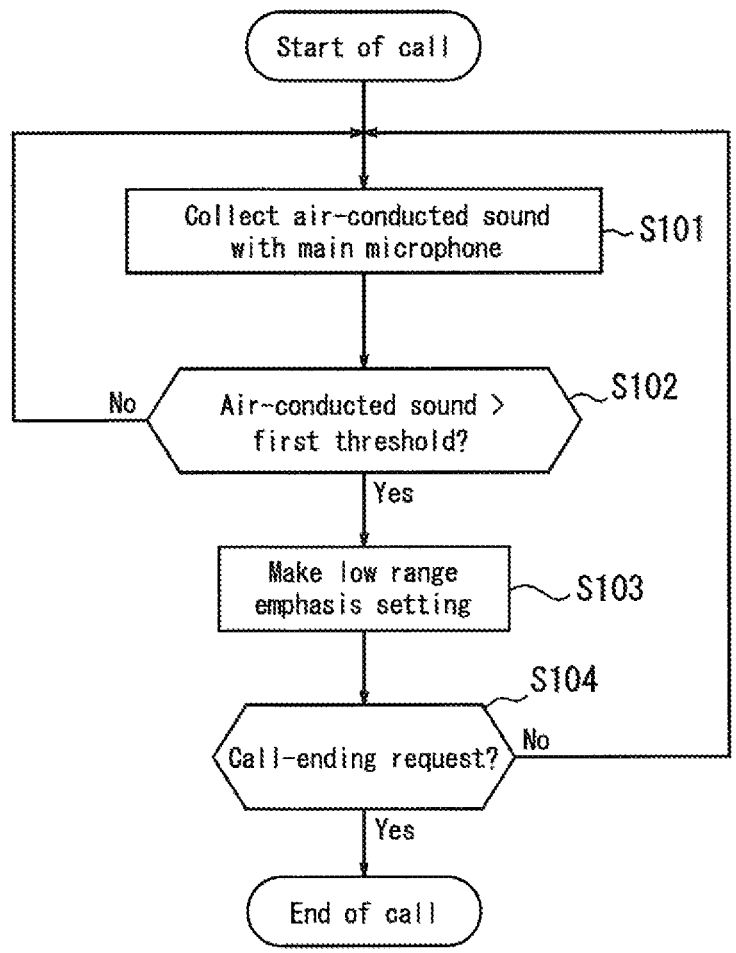
FIG. 5 is a flowchart of low-range emphasis setting based on sound collection by the main microphone.

FIG. 5 is a flowchart of low-range emphasis setting based on air-conducted sound collected by the main microphone 42. After the start of a conversation, the main microphone 42 collects air-conducted sound from the panel 10 (step S101). Air-conducted sound can be detected by, for example, the control unit 50 periodically sampling the output signal of the main microphone 42 and performing a frequency analysis within the transmitted audio frequency range on the sampling output. The control unit 50 determines whether the air-conducted sound collected by the main microphone 42 exceeds a first threshold (step S102). The first threshold is a standard for determining whether an echo is being generated in the main microphone 42 and can be set in accordance with the housing structure, usage conditions, or the like of the electronic device 1. When the air-conducted sound collected by the main microphone 42 exceeds the first threshold (step S102: Yes), the control unit 50 notifies the equalizer 44 accordingly. The equalizer 44 then makes a low-range emphasis setting to emphasize the low frequency range more than the high frequency range (step S103). The processing in steps S101 to S103 is repeated until either party issues a call-ending request (step S104). It is thus possible to determine accurately the effect of an echo in the main microphone 42, which cannot cut the input signal for collecting sound by the user, and to reduce the echo.

Figure 6:
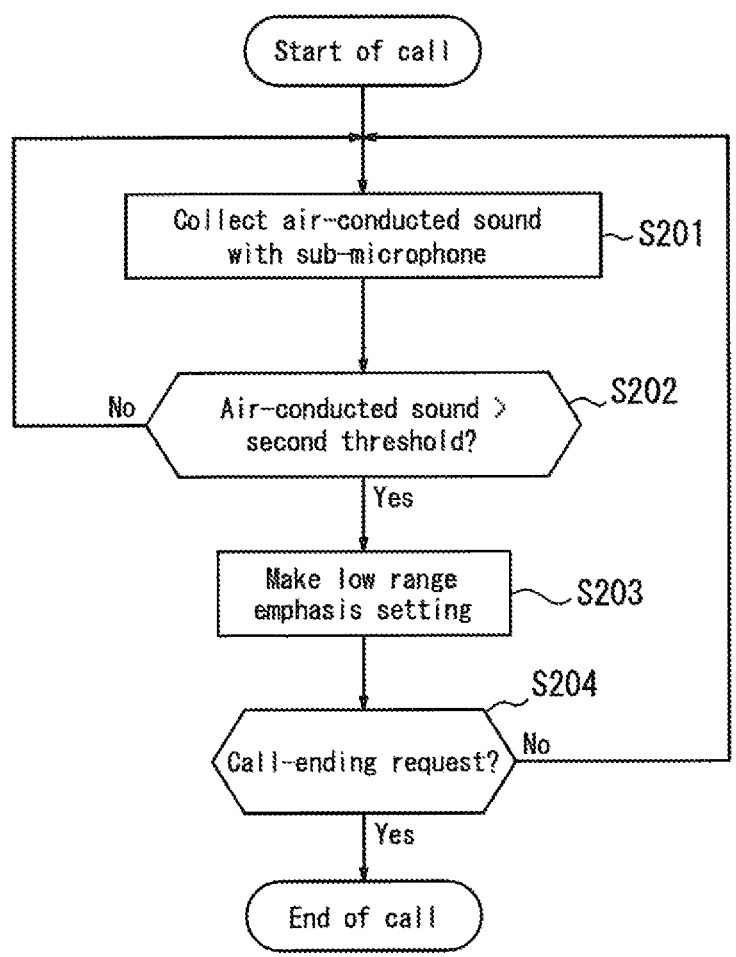
FIG. 6 is a flowchart of low-range emphasis setting based on sound collection by the sub-microphone.

FIG. 6 is a flowchart of low-range emphasis setting based on air-conducted sound collected by the sub-microphone 43. After the start of a conversation, the sub-microphone 43 collects air-conducted sound from the panel 10 (step S201). Air-conducted sound can be detected by, for example, the control unit 50 periodically sampling the output signal of the sub-microphone 43 and performing a frequency analysis within the transmitted audio frequency range on the sampling output. The control unit 50 determines whether the air-conducted sound collected by the sub-microphone 43 exceeds a second threshold (step S202). The second threshold is a standard for determining whether an echo is being generated in the sub-microphone 43 and can be set in accordance with the housing structure, usage conditions, or the like of the electronic device 1. When the air-conducted sound collected by the sub-microphone 43 exceeds the second threshold (step S202: Yes), the control unit 50 notifies the equalizer 44 accordingly. The equalizer 44 then makes a low-range emphasis setting to emphasize the low frequency range more than the high frequency range (step S203). The processing in steps S201 to S203 is repeated until either party issues a call-ending request (step S204). It is thus possible to determine accurately the sound leaking to the surrounding area and to reduce the echo.

Figure 7:
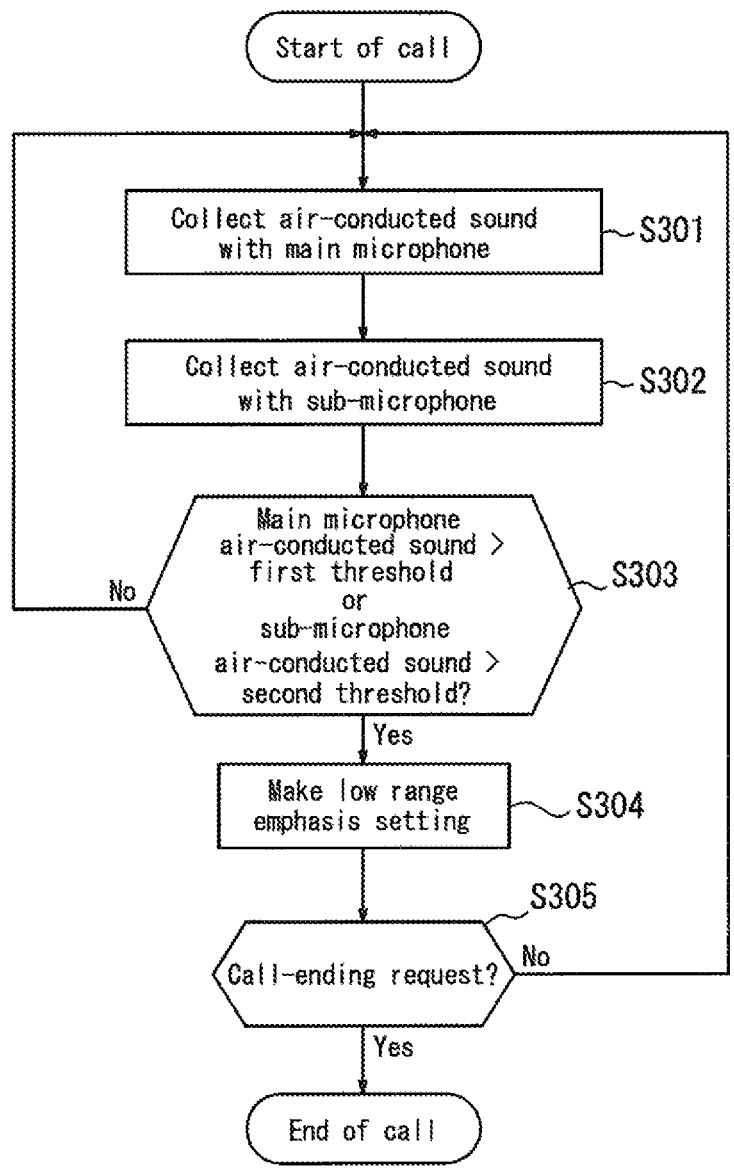
FIG. 7 is a flowchart of low-range emphasis setting based on sound collection by the main microphone and the sub-microphone.

FIG. 7 is a flowchart of low-range emphasis setting based on air-conducted sound collected by the main microphone 42 and the sub-microphone 43. After the start of a conversation, the main microphone 42 collects air-conducted sound from the panel 10 (step S301). The sub-microphone 43 also collects air-conducted sound from the panel 10 (step S302). The control unit 50 determines whether the air-conducted sound collected by the main microphone 42 exceeds a first threshold or the air-conducted sound collected by the sub-microphone 43 exceeds a second threshold (step S303). When the air-conducted sound collected by the main microphone 42 exceeds the first threshold or the air-conducted sound collected by the sub-microphone 43 exceeds the second threshold (step S303: Yes), the control unit 50 notifies the equalizer 44 accordingly. The equalizer 44 then makes a low-range emphasis setting to emphasize the low frequency range more than the high frequency range (step S304). The processing in steps S301 to S304 is repeated until either party issues a call-ending request (step S305). It is thus possible accurately to determine the effect of an echo in the main microphone 42 and to determine the sound leaking to the surrounding area, and it is possible to reduce the echo.

When an echo is generated due to sound leakage in the electronic device 1, it is possible to reduce the echo by the control unit 50 lowering the volume of the air-conducted sound. FIG. 8 is a flowchart of receiver volume level setting. After the start of a conversation, the control unit 50 sets the receiver volume level for reproducing receiver audio (step S401). Based on the receiver volume level that is set, the control unit 50 adjusts the strength of the electric signal applied to the piezoelectric element 30. Next, the main microphone 42 collects air-conducted sound from the panel 10 (step S402). The sub-microphone 43 also collects air-conducted sound from the panel 10 (step S403). The control unit 50 determines whether the difference between air-conducted sound collected by the sub-microphone 43 and air-conducted sound collected by the main microphone 42 exceeds a third threshold (step S403). For example, when sound leakage from the piezoelectric receiver is large, air-conducted sound enters both the main microphone 42 and the sub-microphone 43. Since the sub-microphone 43 is provided nearer the piezoelectric element 30 than the main microphone 42 is, the air-conducted sound collected by the sub-microphone 43 is larger than the air-conducted sound collected by the main microphone 42. The third threshold is a standard for determining whether an echo is being generated based on the difference between air-conducted sound collected by the sub-microphone 43 and air-conducted sound collected by the main microphone 42 and can be set in accordance with the housing structure, usage conditions, or the like of the electronic device 1. When the difference between air-conducted sound collected by the sub-microphone 43 and air-conducted sound collected by the main microphone 42 exceeds the third threshold, the control unit 50 sets a new receiver volume level to be the resulting value upon subtracting a predetermined offset from the current receiver volume level (step S405). Since the control unit 50 thus controls the piezoelectric element 30 to suppress or reduce vibration of the panel 10, the echo caused by sound leakage can be reduced. The predetermined offset can be set in accordance with the housing structure, usage conditions, or the like of the electronic device 1. The processing in steps S402 to S405 is repeated until either party issues a call-ending request (step S406). When sound leakage occurs, it is thus possible to reduce an echo.

Embodiment 1

Figure 9A:
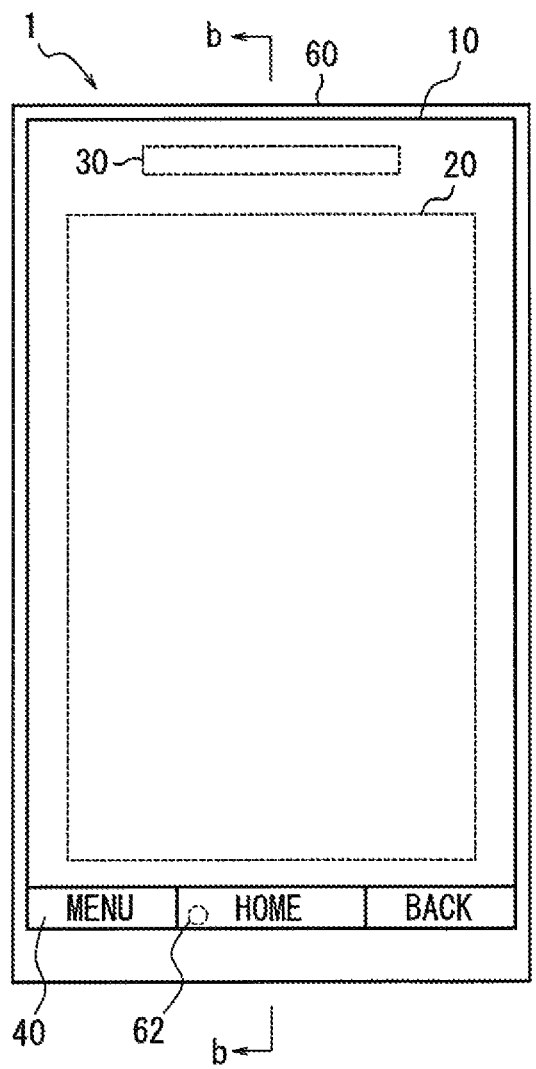
FIGS. 9(a) and 9(b) illustrate a housing structure of the electronic device according to Embodiment 1.
Figure 9B:
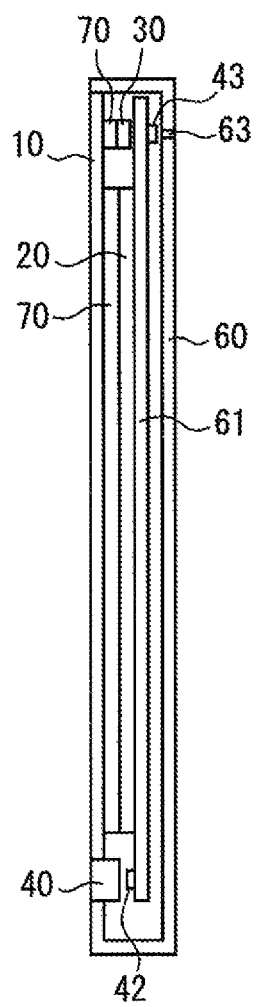

FIGS. 9(a) and 9(b) illustrate a housing structure of the electronic device 1 according to Embodiment 1. FIG. 9(a) is a front view, and FIG. 9(b) is a cross-sectional view along the b-b line of FIG. 9(a). The electronic device 1 illustrated in FIGS. 9(a) and 9(b) is a smartphone in which a touch panel that is a glass plate is disposed on the front face (expected contact region) of the housing 60 (for example a metal or resin case) as the panel 10. The panel 10 and the input unit 40 are supported by the housing 60, and the display unit 20 and piezoelectric element 30 are each adhered to the panel 10 by a joining member 70. The joining member 70 is adhesive with thermosetting properties, ultraviolet curable properties, or other such properties; double-sided tape; or the like. The joining member 70 may, for example, be optical elasticity resin, which is clear and colorless acrylic ultraviolet curing adhesive. The panel 10, display unit 20, and piezoelectric element 30 are each generally rectangular. The display unit 20 is connected to a circuit board 61. The sub-microphone 43 is provided at one edge (upper part) in the longitudinal direction of the circuit board 61, and the main microphone 42 is provided at the other edge (lower part) in the longitudinal direction. In other words, the main microphone 42 is provided in a mouth-neighboring region of the housing 60 near the mouth of the user, and the sub-microphone 43 is provided on the opposite face from the panel 10 of the housing 60. An opening 62 for sound collection by the main microphone 42 is formed in the input unit 40, as indicated by the dashed line. An opening 63 for sound collection by the sub-microphone 43 is also formed in the housing 60. The openings 62 and 63 should be blocked by a member permeable by air but not liquid. Gore-Tex (registered trademark) is an example of a member permeable by air but not liquid.

The display unit 20 is disposed in approximately the center in the transverse direction of the panel 10. The piezoelectric element 30 is disposed at a predetermined distance from an edge of the panel 10 in the longitudinal direction, near the edge so that the longitudinal direction of the piezoelectric element 30 is aligned with the short sides of the panel 10. The display unit 20 and the piezoelectric element 30 are disposed side by side, in parallel directions, on the inner face of the panel 10.

Figure 10:
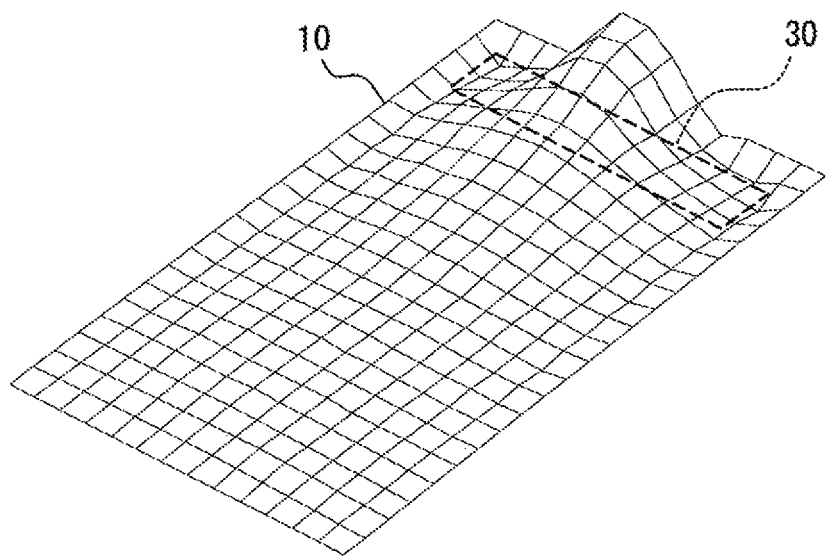
FIG. 10 illustrates an example of vibration of a panel in the electronic device according to Embodiment 1.

FIG. 10 illustrates an example of vibration of the panel 10 in the electronic device 1 according to Embodiment 1. In the electronic device 1 according to Embodiment 1, the display unit 20 is attached to the panel 10. Therefore, it is more difficult for the lower part of the panel 10 to vibrate as compared to the upper part of the panel 10 where the piezoelectric element 30 is attached. As a result, at the lower part of the panel 10, sound leakage due to vibration of the lower part of the panel 10 is reduced. The upper part of the panel 10 is bent directly by the piezoelectric element 30, and hence compared to the upper part, vibration dampens at the lower part. The panel 10 is bent by the piezoelectric element 30 in the direction of the long sides of the piezoelectric element 30 such that the portion of the panel 10 immediately above the piezoelectric element 30 rises the highest as compared to adjacent portions.

In the electronic device 1 according to the present embodiment, the panel 10 thus deforms in conjunction with deformation of the piezoelectric element 30 attached to the back face of the panel 10, so that air-conducted sound and vibration sound are transmitted to an object that contacts the deforming panel 10. As a result, air-conducted sound and vibration sound can be transmitted to the user without projecting the vibrating body from the outer surface of the housing 60, thereby improving usability over the electronic device disclosed in Patent Literature 1, in which a vibrating body extremely small as compared to the housing is pressed against a human body. The piezoelectric element 30 also does not damage easily, since the user's ear need not be pressed against the piezoelectric element itself. Moreover, causing the housing 60 rather than the panel 10 to deform makes it easier for the user to drop the terminal when vibration is generated, whereas vibrating the panel 10 makes such dropping of the terminal unlikely.

The piezoelectric element 30 is joined to the panel 10 by the joining member 70. The piezoelectric element 30 can thus be attached to the panel 10 in a way that avoids restricting the degree of freedom for deformation of the piezoelectric element 30. The joining member 70 may be a non-heat hardening adhesive. Such adhesive has the advantage that, during hardening, thermal stress contraction does not easily occur between the piezoelectric element 30 and the panel 10. The joining member 70 may also be double-sided tape. Such tape has the advantage that the contraction stress when using adhesive is not easily produced between the piezoelectric element 30 and the panel 10.

The main microphone 42 is provided in a mouth-neighboring region of the housing 60 near the mouth of the user. It is thus possible to determine accurately the effect of an echo on the microphone that collects speech of the user. The sub-microphone 43 is provided on the opposite face from the panel 10 of the housing 60. It is thus possible to determine accurately the sound leakage at the opposite face from the user's ear and to reduce the effect of sound leakage to the surrounding area.

Embodiment 2

FIGS. 11(a), 11(b), and 11(c) illustrate a housing structure of the electronic device 1 according to Embodiment 2. FIG. 11(a) is a front view, FIG. 11(b) is a cross-sectional view along the b-b line of FIG. 11(a), and FIG. 11(c) is a cross-sectional view along the c-c line of FIG. 11(a). The electronic device 1 illustrated in FIGS. 11(a) to 11(c) is a clamshell mobile phone in which a cover panel (an acrylic plate) protecting the display unit 20 is disposed on the front face (expected contact region) at the upper side of the housing 60 as the panel 10. In Embodiment 2, a reinforcing member 80 is disposed between the panel 10 and the piezoelectric element 30. The reinforcing member 80 is, for example, a resin plate, sheet metal, or a resin plate including glass fiber. In other words, in the electronic device 1 according to Embodiment 2, the piezoelectric element 30 and the reinforcing member 80 are adhered by the joining member 70, and furthermore the reinforcing member 80 and the panel 10 are adhered by the joining member 70. Furthermore, in Embodiment 2, the display unit 20 is not adhered to the panel 10, but rather is supported by the housing 60. In other words, in the electronic device 1 according to Embodiment 2, the display unit 20 is separated from the panel 10 and is joined to a support 90, which is a portion of the housing 60, by the joining member 70. The support 90 is not limited to being a portion of the housing 60 and may be configured using metal, resin, or the like to be a member independent from the housing 60. The sub-microphone 43 is provided at the upper side of the housing 60, and the main microphone 42 is provided at the lower side. In other words, the main microphone 42 is provided in a mouth-neighboring region of the housing 60 near the mouth of the user, and the sub-microphone 43 is provided on an opposite face from the panel 10 of the housing 60. An opening 62 for sound collection by the main microphone 42 is formed on the front face of the housing 60 at the lower side, facing the main microphone 42. An opening 63 for sound collection by the sub-microphone 43 is also formed on the back face of the housing 60. The openings 62 and 63 should be blocked by a member permeable by air but not liquid. Gore-Tex (registered trademark) is an example of a member permeable by air but not liquid.

Figure 12:
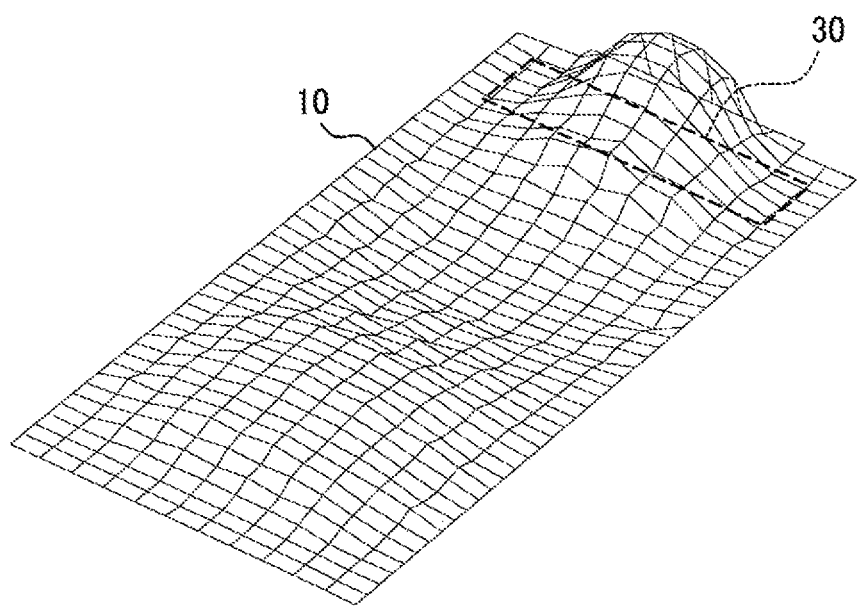
FIG. 12 illustrates an example of vibration of a panel in the electronic device according to Embodiment 2.

FIG. 12 illustrates an example of vibration of the panel 10 in the electronic device 1 according to Embodiment 2. In the electronic device 1 according to Embodiment 2, the panel 10 is an acrylic plate with lower rigidity than a glass plate, and the display unit 20 is not adhered to the back face of the panel 10. Therefore, as compared to the electronic device 1 according to Embodiment 1 illustrated in FIG. 10, the amplitude produced by the piezoelectric element 30 is greater. Moreover, the panel 10 vibrates not only in the region in which the piezoelectric element 30 is attached, but also in a region separate from the attachment region. Therefore, in addition to air-conducted sound, the user can hear vibration sound by contacting the ear to any position on the panel 10.

In the electronic device 1 according to the present embodiment, the reinforcing member 80 and the panel 10 deform in conjunction with deformation of the piezoelectric element 30 attached to the panel 10 via the reinforcing member 80, so that air-conducted sound and vibration sound are transmitted to an object that contacts the deforming panel 10. As a result, air-conducted sound and vibration sound can be transmitted to the user without the user's ear being pressed against the vibrating body itself. Furthermore, the piezoelectric element 30 is attached to the surface of the panel 10 that faces the inside of the housing 60. Air-conducted sound and vibration sound can thus be transmitted to the user without projecting the vibrating body from the outer surface of the housing 60. Moreover, the panel 10 deforms not only in the region in which the piezoelectric element 30 is attached, but rather throughout the panel 10 in order to transmit air-conducted sound and vibration sound. Therefore, in addition to air-conducted sound, the user can hear vibration sound by contacting the ear to any position on the panel 10.

Disposing the reinforcing member 80 between the piezoelectric element 30 and the panel 10 can reduce the probability of an external force being transmitted to and damaging the piezoelectric element 30 if, for example, such a force is applied to the panel 10. Moreover, even if the panel 10 is pressed firmly against a human body, vibrations of the panel 10 do not dampen easily. By disposing the reinforcing member 80 between the piezoelectric element 30 and the panel 10, the resonance frequency of the panel 10 also decreases, thereby improving the acoustic characteristics in the low frequency band. Note that instead of the reinforcing member 80, a plate-shaped anchor may be attached to the piezoelectric element 30 by the joining member 70.

The main microphone 42 is provided in a mouth-neighboring region of the housing 60 near the mouth of the user. It is thus possible to determine accurately the effect of an echo on the microphone that collects speech of the user. The sub-microphone 43 is provided on the opposite face from the panel 10 of the housing 60. It is thus possible to determine accurately the sound leakage at the opposite face from the user's ear and to reduce the effect of sound leakage to the surrounding area.

Although the present invention has been described by way of embodiments with reference to the accompanying drawings, it is to be noted that various changes and modifications will be apparent to those skilled in the art based on the present disclosure. Therefore, such changes and modifications are to be understood as included within the scope of the present invention. For example, the functions and the like included in the various members and steps may be reordered in any logically consistent way. Furthermore, components or steps may be combined into one or divided.

For example, as illustrated in FIG. 13, the panel 10 may be joined to the housing 60 by the joining member 70. Making it difficult for vibration to be transmitted directly from the panel 10 to the housing 60 in this way reduces the risk of the user dropping the electronic device 1 as compared to when the housing itself vibrates significantly. The joining member 70 may be a non-heat hardening adhesive. Such adhesive has the advantage that, during hardening, thermal stress contraction does not easily occur between the housing 60 and the panel 10. The joining member 70 may also be double-sided tape. Such tape has the advantage that the contraction stress when using adhesive is not easily produced between the housing 60 and the panel 10.

For example, when the panel 10 and the display unit 20 do not overlap, the piezoelectric element 30 may be disposed at the center of the panel 10. When the piezoelectric element 30 is disposed at the center of the panel 10, vibration of the piezoelectric element 30 is transmitted uniformly across the entire panel 10, thereby improving quality of air-conducted sound and permitting recognition of vibration sound when the user contacts the ear to any of various positions on the panel 10. As in the above-described embodiments, a plurality of piezoelectric elements 30 may also be provided.

The piezoelectric element 30 is attached to the panel 10 in the above electronic device 1 but instead may be attached to a location other than the panel 10. For example, the piezoelectric element 30 may be attached to a battery lid that is attached to the housing 60 and covers a battery. Since the battery lid is often attached to a different face than the panel 10 in the electronic device 1 that is a mobile phone or the like, according to this structure the user can hear sound by contacting a part of the body (such as the ear) to a different face than the panel 10.

Furthermore, the panel 10 may constitute a portion or the entirety of any of a display panel, an operation panel, a cover panel, or a lid panel that allows for removal of a rechargeable battery. In particular, when the panel 10 is a display panel, the piezoelectric element 30 is disposed on the outside of a display region fulfilling a display function. This offers the advantage of not blocking the display. The operation panel includes the touch panel of Embodiment 1. The operation panel also includes a sheet key, in which the tops of operation keys are integrally formed in, for example, a clamshell mobile phone so as to constitute one face of the housing alongside an operation unit.

Note that in Embodiments 1 and 2, the joining member that adheres the panel 10 and the piezoelectric element 30, the joining member that adheres the panel 10 and the housing 60, and the like have been described as the joining member 70, using the same reference numeral. The joining members used in Embodiments 1 and 2, however, may differ as needed in accordance with the components being joined.

For example, in the above-described embodiments, an example of the usable frequency range for audio has been described as being the range of 0.4 kHz to 3.4 kHz for a reproduction sound signal pertaining to a voice call, yet the usable frequency range is not limited in this way. The present invention is also applicable when using, for example, an audio signal for which the usable frequency range is from 0.1 kHz to 7 kHz. In this case, the low frequency range may be from 0.1 kHz to 5 kHz and the high frequency range from over 5 kHz to 7 kHz. These ranges for the low frequency range and the high frequency range may of course be modified as necessary from the perspectives of piezoelectric element performance, panel characteristics, power consumption, sound leakage, and the like.

REFERENCE SIGNS LIST

1: Electronic device
10: Panel
20: Display unit
30: Piezoelectric element
40: Input unit
50: Control unit
41: Transceiver
42: Main microphone (first microphone)
43: Sub-microphone (second microphone)
44: Equalizer
60: Housing
61: Circuit board
62: Opening
63: Opening
70: Joining member
80: Reinforcing member
90: Support

The invention claimed is:

1. An electronic device comprising:
a piezoelectric element;
a vibrating plate configured to vibrate due to the piezoelectric element;
a first microphone configured to collect speech of a user;
a second microphone configured to collect surrounding sound; and
an equalizer,
the electronic device causing the vibrating plate to generate air-conducted sound and vibration sound that is transmitted by vibrating a part of a human body, and
the equalizer making a low-range emphasis setting, to emphasize a low frequency range more than a high frequency range of the air-conducted sound, when a volume of the air-conducted sound collected by the first microphone exceeds a first threshold or when a volume of the air-conducted sound collected by the second microphone exceeds a second threshold.

2. The electronic device according to claim 1, wherein the vibrating plate is positioned in an expected contact region of a housing where an ear of a user is expected to contact, and the first microphone is provided in a mouth-neighboring region of the housing near a mouth of the user.

3. The electronic device according to claim 1, wherein the vibrating plate is positioned in an expected contact region of a housing where an ear of a user is expected to contact, and the second microphone is provided on an opposite face from the vibrating plate of the housing.

4. A method for controlling an electronic device that includes a piezoelectric element, a vibrating plate configured to vibrate due to the piezoelectric element, a first microphone configured to collect speech of a user, a second microphone configured to collect surrounding sound, and an equalizer, the electronic device causing the vibrating plate to generate air-conducted sound and vibration sound that is transmitted by vibrating a part of a human body, the method comprising the step of:
making a low-range emphasis setting, for the equalizer to emphasize a low frequency range more than a high frequency range of the air-conducted sound, when a volume of the air-conducted sound collected by the first microphone exceeds a first threshold or when a volume of the air-conducted sound collected by the second microphone exceeds a second threshold.

5. An electronic device comprising:
a piezoelectric element;
a vibrating plate configured to vibrate due to the piezoelectric element;
a main microphone;
a sub-microphone; and
a control unit,
the electronic device causing the vibrating plate to generate air-conducted sound and vibration sound that is transmitted by vibrating a part of a human body, and
the control unit controlling the piezoelectric element so as to suppress or reduce vibration of the vibrating plate when a difference between a volume of the air-conducted sound collected by the first microphone and a volume of the air-conducted sound collected by the second microphone exceeds a predetermined threshold.

6. A method for controlling an electronic device that includes a piezoelectric element, a vibrating plate configured to vibrate due to the piezoelectric element, a main microphone, a sub-microphone, and a control unit, the electronic device causing the vibrating plate to generate air-conducted sound and vibration sound that is transmitted by vibrating a part of a human body, the method comprising the step of:

controlling, via the control unit, the piezoelectric element so as to suppress or reduce vibration of the vibrating plate when a difference between a volume of the air-conducted sound collected by the first microphone and a volume of the air-conducted sound collected by the second microphone exceeds a predetermined threshold.

\* \* \* \* \*